June 25, 1968 FRITZ-WERNER BEYERLEIN 3,390,226
ENCAPSULATED SEMICONDUCTOR ELEMENT
Filed Oct. 18, 1965

United States Patent Office 3,390,226

Patented June 25, 1968

3,390,226

ENCAPSULATED SEMICONDUCTOR ELEMENT

Fritz-Werner Beyerlein, Munich, Germany, assignor to Siemens Aktiengesellschaft, a corporation of Germany Filed Oct. 18, 1965, Ser. No. 497,088
Claims priority, application Germany, Oct. 19, 1964, S 93,786
6 Claims. (Cl. 174—52)

ABSTRACT OF THE DISCLOSURE

Semiconductor circuit element includes a semiconductor body, a plurality of conductive leads connected to the body, and a housing surrounding the body, the housing comprising an inner portion of insulating material wherein the body is embedded, and an outer layer of insulating material wherein metallic particles are incorporated, the outer layer being relatively thin compared to the thickness of the inner portion and being formed with a plurality of openings, the inner portion of insulating material having a plurality of sleevelike projections respectively extending through the openings, and the conductive leads extending through the respective sleevelike projections to the exterior of the housing, whereby the leads are insulated from the outer layer.

*Specification*

Figure 1:
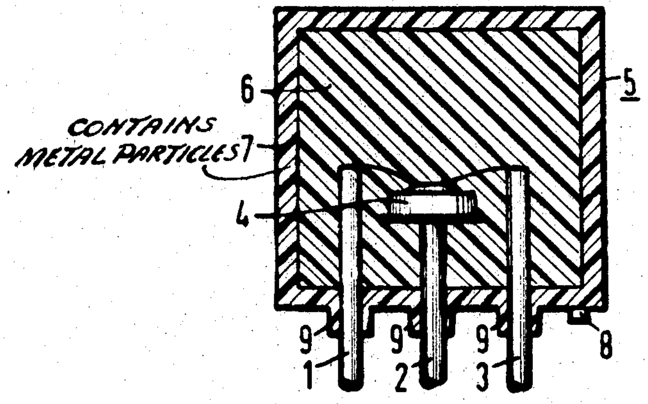

My invention relates to semiconductor devices. More particularly, it relates to improvements in the housings of such devices for effecting advantageous heat dissipation.

In the construction of semiconductor devices for use as circuit elements, the semiconductor body and electrical leads therefrom are embedded in an insulating material, the embedded body being enclosed by a metal housing. In such devices, it is a known technique to improve the heat dissipation characteristics of the semiconductor body by providing within the housing, a layer of an insulating filler material having metal particles incorporated therein, the semiconductor body and its electrode leads being insulated from such layer. To enable desirable heat transfer from the semiconductor, such layer has to be sufficiently thin whereby it does not impair heat transfer characteristics and, accordingly, the layer is chosen to have a thickness of only a few $\mu$. Alternatively, it is also known to employ a non-metallic housing for semiconductor elements upon which there is suitably deposited, as by spraying with a spray gun, a metal coating, the metal coating serving as a shield for the circuit element or elements contained within the non-metallic housing.

It is an important object of this invention to provide an improved housing for a semiconductor element which enables advantageous heat dissipation.

This object is achieved by providing an insulating member for a semiconductor element which comprises an insulating envelope for the semiconductor element in which only a thin and outer layer of the envelope contains therein metal particles, such outer layer serving as the shielding housing. Thus, according to the invention, the metal particle containing outer layer of insulating material is quite thin as compared to the total size of the insulating envelope, the metal particles being insulated from the electrical leads of the semiconductor element by the insulating material. Furthermore, if desired, an additional metallic deposit may be provided on the outer surface of the insulating layer. Suitable insulating materials may be epoxy resins, silicone resins, polyester resins, other thermoplastic synthetic materials and inorganic cements. Suitable examples of the metals to be incorporated in the insulating envelope are iron, silver or copper, such metals suitably being incorporated into the insulating envelope in powder form. The insulating member as set forth hereinabove, does not require an additional metallic housing.

Generally speaking and in accordance with the invention, there is provided a housing for a semiconductor circuit element comprising a body including an inner portion comprising an insulating material, the element being enveloped by the inner portion, and a thin outer layer on the inner portion of the material comprising an insulating material having metallic particles incorporated therein.

The foregoing and more specific objects and features of my invention will be apparent from, and will be mentioned in the following description of a housing for a semiconductor element according to the invention taken together with the accompanying drawing.

Figure 2:
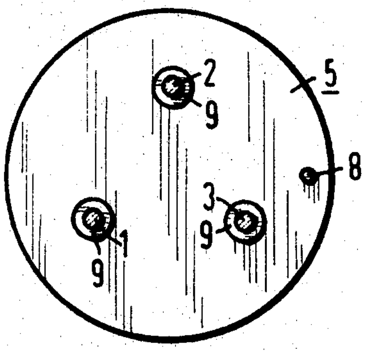

In the drawing,

FIG. 1 is a longitudinal cross-sectional view of an illustrative embodiment of a housing for a semiconductor element constructed in accordance with the principles of the invention; and FIG. 2 is a bottom view of the housing shown in FIG. 1.

Referring now to FIGS. 1 and 2 wherein there are respectively shown a longitudinal cross-sectional view and a bottom view of an illustrative embodiment of a device constructed in accordance with the principles of the invention, the semiconductor element 4 therein, which may be a transistor, for example, has associated therewith electrode wire leads 1, 2 and 3. The semiconductor body portion of transistor 4 and portions of leads 1, 2 and 3 are embedded in an insulating material envelope 5 which may be of a suitable configuration such as spherical, cylindrical, parallelepiped, etc. Envelope 5 comprises an inner and larger portion 6 and an outer and smaller portion 7. Portions 6 and 7 suitably may comprise the same insulating material but portion 7 also has incorporated therein metallic particles. To provide adequate shielding for the total structure shown in FIGS. 1 and 2, it has been found to be advantageous for the metallic particles-insulating material combination in portion 7 be combined in a ratio of parts by volume in a range of 0.5 to 10 parts of insulating material to one part by volume of metallic material. Such ratio ensures both an adequate shielding and adequate cohesion of the insulating material in the insulating portion of outer layer 7. Since there is a relatively high content of metal in outer layer 7, it is appropriate to ground this layer, suitably by means of a terminal connection 8 which is provided therefor.

The respective portions of wire leads 1, 2 and 3 which pass through the metal containing outer layer 7, have to be insulated from this layer. As seen in FIG. 1, such insulating is effected by the providing of sleeves 9, which are suitably cast from the insulating material constituting inner portion 6, around the aforesaid portions of wire leads 1, 2 and 3. Sleeves 9 may be suitably provided around the pertinent portions of leads 1, 2 and 3 respectively during the production of inner portion 6 to prevent their contacting outer layer 7. Outer layer 7, which constitutes the shielding, is applied to inner portion 6 with a lesser strength than would be required if it were applied to the total thickness of sleeves 9.

Suitable techniques for applying inner insulating material portion 6 and outer insulating material-metallic powder portion 7 may be the application of these materials by immersion, casting, or spray deposition. Outer layer 7 preferably should encompass the entire outer periphery of inner portion 6. Electric terminal 8 of outer layer 7 is preferably embedded in layer 7 during the time that layer 7 is applied. Consequently, during the hardening of portions 6 and 7, terminal 8 becomes respectively rigidly and conductively connected therewith.

A variation of the above-described techniques to enable the elimination of the need for individual insulating sleeves 9 on leads 1, 2 and 3 may be to not have outer layer 7 extend up to these sleeves and, thereafter, to remove the portions of outer layer 7 which are adjacent to these leads.

It will be obvious to those skilled in the art upon studying this disclosure, that housings for semiconductor elements, according to my invention, permit of a great variety of modifications and hence can be given embodiments other than those particularly described herein without departing from the essential features of my invention and within the scope of the claims annexed hereto.

I claim:

1. Semiconductor circuit element comprising a semiconductor body, a plurality of conductive leads connected to said body, and a housing surrounding said body, said housing comprising an inner portion of insulating material wherein said body is embedded, and an outer layer of insulating material wherein metallic particles are incorporated, said outer layer being relatively thin compared to the thickness of said inner portion and being formed with a plurality of openings, said inner portion of insulating material having a plurality of sleevelike projections respectively extending through said openings, and said conductive leads extending through said respective sleevelike projections to the exterior of said housing, whereby said leads are insulated from said outer layer.

2. A semiconductor circuit element as defined in claim 1 wherein said insulating materials comprising said inner portion and said outer layer respectively are the same.

3. A semiconductor circuit element as defined in claim 1 wherein said insulating materials are selected from the group consisting of synthetic resins, synthetic thermoplastic materials, and inorganic cements.

4. A semiconductor circuit element as defined in claim 3 wherein said metallic particles are selected from the group consisting of iron, silver, and copper particles, and said synthetic resins are selected from the group consisting of epoxy, silicone, and polyester resins.

5. A semiconductor circuit element as defined in claim 1 wherein said outer layer comprises said insulating material and said metallic particles in a ratio of 0.5–10 parts of insulating material to 1 part of metallic particles by volume.

6. A housing for a semiconductor circuit element as defined in claim 1 and further including a terminal in said outer layer adapted for grounding said outer layer.

References Cited

UNITED STATES PATENTS

| | | | |
|---|---|---|---|
| 2,307,027 | 1/1943 | Davie et al. | 174—35 |
| 2,450,310 | 9/1948 | Sporing et al. | 174—51 |
| 2,829,320 | 4/1958 | Diamond | 174—52 |
| 2,967,984 | 1/1961 | Jamison | 174—52 |

DARRELL L. CLAY, *Primary Examiner.*

L. H. MYERS, *Examiner.*

D. A. TONE, *Assistant Examiner.*